US007140093B2

(12) United States Patent
McCord

(10) Patent No.: US 7,140,093 B2
(45) Date of Patent: Nov. 28, 2006

(54) PROCESS FOR FABRICATING A MAGNETO-RESISTIVE (MR) SENSOR

(75) Inventor: Jeffrey G. McCord, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 67 days.

(21) Appl. No.: 10/934,713

(22) Filed: Sep. 3, 2004

(65) Prior Publication Data
US 2005/0052791 A1  Mar. 10, 2005

Related U.S. Application Data

(62) Division of application No. 10/255,867, filed on Sep. 26, 2002, now Pat. No. 6,906,899.

(51) Int. Cl.
*G11B 5/127* (2006.01)
*H04R 31/00* (2006.01)
(52) U.S. Cl. ............... 29/603.13; 29/603.07; 29/603.11; 29/603.14; 360/324.11; 360/324.12; 427/127; 427/128; 428/692; 428/694
(58) Field of Classification Search ............ 29/603.07, 29/603.08, 603.11–603.16, 603.18; 360/324.11, 360/324.12; 216/62, 65, 66; 427/127, 128; 428/692, 694
See application file for complete search history.

(56) References Cited

U.S. PATENT DOCUMENTS 6,084,405 A * 7/2000 Suzuki ................ 324/252

6,150,045 A * 11/2000 Saito et al. ............... 428/811.2
6,741,429 B1 * 5/2004 Baglin et al. ............... 360/313

FOREIGN PATENT DOCUMENTS

JP   09161230 A  *  6/1997

OTHER PUBLICATIONS

"Noise characteristics of tunneling magnetoresistive sensors"; Hae Seok Cho; Nazarov, A; Nowak, J.; Tabat, N.; Magnetics Conference, 2002. INTERMAG Europe; Apr. 28-May 2, 2002; pp. BP11.*

* cited by examiner

*Primary Examiner*—Paul D. Kim
(74) *Attorney, Agent, or Firm*—Zilka-Kotab, PC

(57) ABSTRACT

A magneto-resistive (MR) sensor is provided including a pinned layer, and a free layer disposed above the pinned layer. Also included is a pair of leads disposed over portions of the free layer. Further, a pinning layer is disposed below the pinned layer. Disposed below the pinning layer is an underlayer. For enhanced operation, first portions of the pinned layer disposed below the leads have a first pinned layer magnetization parallel with a free layer magnetization associated with the free layer in the absence of an external field. Further, a second portion of the pinned layer has a second pinned layer magnetization perpendicular with the free layer magnetization in the absence of the external field.

8 Claims, 8 Drawing Sheets

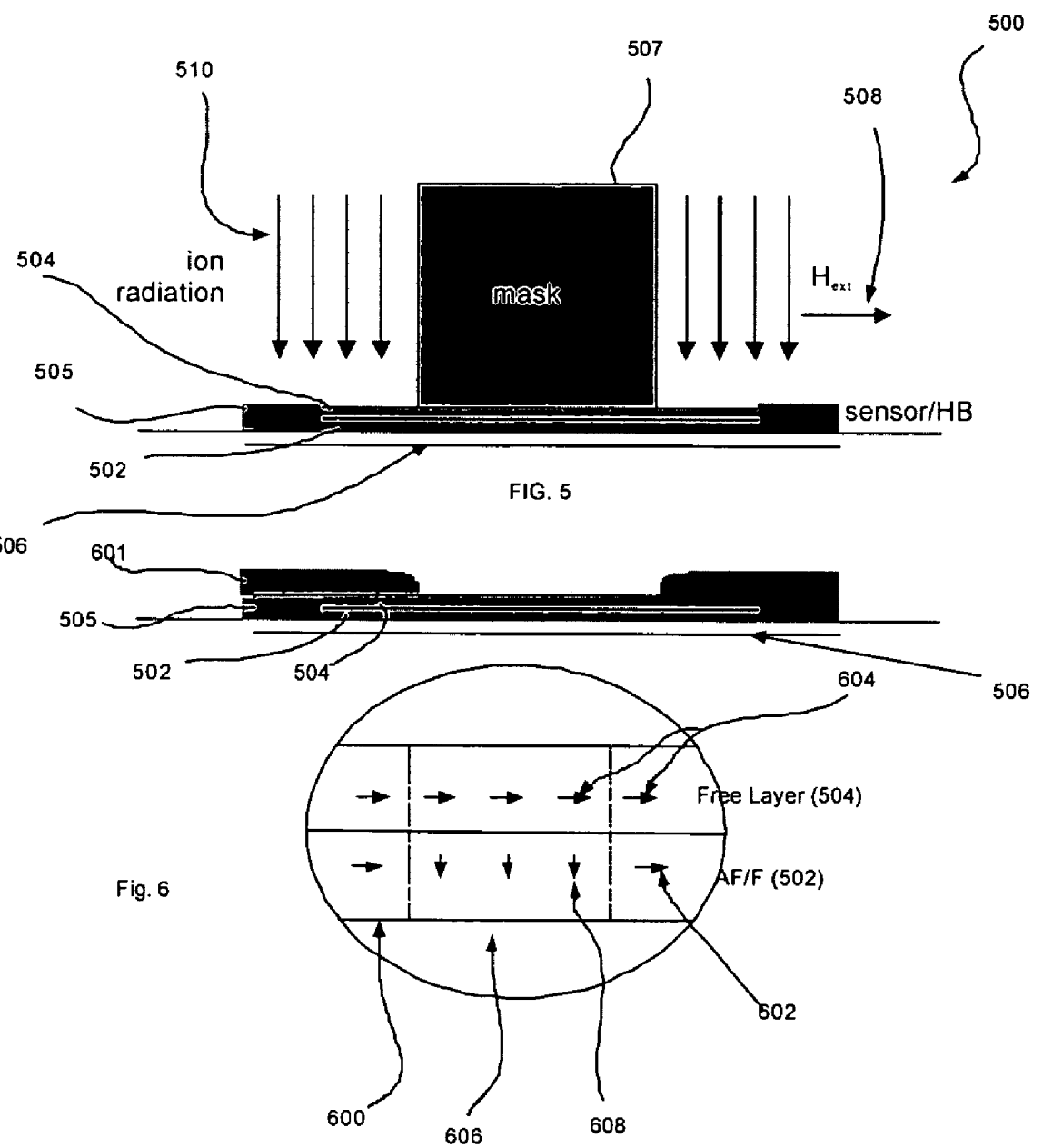

PROCESS FOR FABRICATING A MAGNETO-RESISTIVE (MR) SENSOR

RELATED APPLICATIONS

This application is a divisional of U.S. patent application Ser. No. 10/255,867 filed Sep. 26, 2002 now U.S. Pat. No. 6,906,899.

FIELD OF THE INVENTION

The present invention relates to magneto-resistive (MR) heads, and more particularly, this invention relates to MR head processing.

BACKGROUND OF THE INVENTION

Computer systems generally utilize auxiliary memory storage devices having media on which data can be written and from which data can be read for later use. A direct access storage device (disk drive) incorporating rotating magnetic disks is commonly used for storing data in magnetic form on the disk surfaces. Data is recorded on concentric, radially spaced tracks on the disk surfaces. Magnetic heads including read sensors are then used to read data from the tracks on the disk surfaces.

In high capacity disk drives, magnetoresistive read sensors, commonly referred to as MR heads, are the prevailing read sensors because of their capability to read data from a surface of a disk at greater linear densities than thin film inductive heads. An MR sensor detects a magnetic field through the change in the resistance of its MR sensing layer (also referred to as an "MR element") as a function of the strength and direction of the magnetic flux being sensed by the MR layer.

The conventional MR sensor operates on the basis of the anisotropic magnetoresistive (AMR) effect in which an MR element resistance varies as the square of the cosine of the angle between the magnetization of the MR element and the direction of sense current flowing through the MR element. Recorded data can be read from a magnetic medium because the external magnetic field from the recorded magnetic medium (the signal field) causes a change in the direction of magnetization in the MR element, which in turn causes a change in resistance in the MR element and a corresponding change in the sensed current or voltage.

Another type of MR sensor is the giant magnetoresistance (GMR) sensor manifesting the GMR effect. In GMR sensors, the resistance of the MR sensing layer varies as a function of the spin-dependent transmission of the conduction electrons between magnetic layers separated by a non-magnetic layer (spacer) and the accompanying spin-dependent scattering which takes place at the interface of the magnetic and non-magnetic layers and within the magnetic layers.

GMR sensors using only two layers of ferromagnetic material separated by a layer of non-magnetic electrically conductive material are generally referred to as spin valve (SV) sensors manifesting the GMR effect (SV effect). In a spin valve sensor, one of the ferromagnetic layers, referred to as the pinned layer, has its magnetization typically pinned by exchange coupling with an antiferromagnetic (e.g., NiO, Fe-Mn, PtMn) layer. The magnetization of the other ferromagnetic layer, referred to as the free layer, however, is not fixed and is free to rotate in response to the field from the recorded magnetic medium (the signal field). In spin valve sensors, the spin valve effect varies as the cosine of the angle between the magnetization of the pinned layer and the magnetization of the free layer. Recorded data can be read from a magnetic medium because the external magnetic field from the recorded magnetic medium causes a change in the direction of magnetization in the free layer, which in turn causes a change in resistance of the spin valve sensor and a corresponding change in the sensed current or voltage. It should be noted that the AMR effect is also present in the spin valve sensor free layer and it tends to reduce the overall GMR effect.

FIG. 1 shows a typical sensor 100 (not drawn to scale) comprising end regions 104 and 106 separated by a central region 102. The central region 102 has defined edges and the end regions are contiguous with and abut the edges of the central region. As shown, a free layer (free ferromagnetic layer) 110 is positioned above a pinned layer (pinned ferromagnetic layer) 120. In the case of the GMR sensor, the free layer 110 and pinned layer 120 may be separated by a non-magnetic, electrically-conducting spacer 121.

The magnetization of the pinned layer 120 is fixed through exchange coupling with an antiferromagnetic (AFM) layer 125. Free layer 110, pinned layer 120 and the AFM layer 125 are all formed primarily in the central region 102. Hard bias layers 130 and 135 formed in the end regions 104 and 106, respectively, provide longitudinal bias for the free layer 110. Leads 140 and 145 formed over hard bias layers 130 and 135, respectively, provide electrical connections for the flow of the sensing current $I_S$ from a current source 160 to the MR sensor 100. Sensor 170 is connected to leads 140 and 145 senses the change in the resistance due to changes induced in the free layer 110 by the external magnetic field (e.g., field generated by a data bit stored on a disk). IBM's U.S. Pat. No. 5,206,590 granted to Dieny et al. and incorporated herein by reference, discloses an MR sensor operating on the basis of the spin valve effect.

In an MR sensor 100 such as that of FIG. 1, the magnetization of the free layer 110 is perpendicular to the magnetization of the pinned layer 120. FIG. 2 illustrates the manner in which the magnetizations of the free layer 110 and the pinned layer 120 are perpendicular, in accordance with the prior art. In use, this relationship must be maintained between the leads 140 and 145 (i.e. in an active region) to ensure proper operation and the proper "MR-pick up effect."

Unfortunately, portions of the free layer 110 and the pinned layer 120 beneath the leads 140 and 145 (i.e. in an inactive region) sometime exhibit the foregoing relationship, which results in an undesireable MR-pick up effect. In particular, the free layer 110 and the pinned layer 120 beneath the leads 140 and 145 may "pick up" interference or other unwanted signals, thus reducing the reliability of the MR sensor 100. This also makes it difficult to define a track width because the end regions read a read signal during use. It should be noted that there is a continuing desire to make the trackwidth smaller so that more tracks can be fit onto a disk.

There is thus a need for a MR sensor that reads signals only in an active region between a pair of leads, without exhibiting a side MR-pick up effect.

DISCLOSURE OF THE INVENTION

A magneto-resistive (MR) sensor is provided including a pinned layer, and a free layer disposed above the pinned layer. Also included is a pair of leads disposed over portions of the free layer. Further, a pinning layer is disposed below the pinned layer. Disposed below the pinning layer is an underlayer. For enhanced operation, first portions of the pinned layer disposed below the leads have a first pinned layer magnetization parallel with a free layer magnetization associated with the free layer in the absence of an external field. Further, a second portion of the pinned layer has a second pinned layer magnetization perpendicular with the free layer magnetization in the absence of the external field.

In one embodiment, a spacer layer is disposed between the free layer and the pinned layer.

In another embodiment, the first pinned layer magnetization may be generated by applying ion radiation to the MR sensor. Optionally, the MR sensor may be subjected to an external magnetic field during the ion radiation. Further, the MR sensor may be subjected to a predetermined temperature during the ion radiation.

During the foregoing process, the MR sensor may be masked with photoresist for protecting the second portion of the pinned layer from the ion radiation. In other words, the MR sensor may be masked with photoresist for subjecting only the first portions of the pinned layer to the ion radiation.

By this design, the first pinned layer magnetization reduces side-reading effects, and further stabilizes the MR sensor.

Another exchange tab-type MR sensor is provided with a first pinned layer, a free layer disposed above the first pinned layer, a second pinned layer disposed above the free layer, a pair of leads disposed over portions of the second pinned layer, a pinning layer disposed below the first pinned layer, and an underlayer disposed below the pinning layer. To enhance operation, the second pinned layer and first portions of the first pinned layer have a first pinned layer magnetization parallel with a free layer magnetization. Further, a second portion of the first pinned layer has a second pinned layer magnetization perpendicular with the free layer magnetization in the absence of an external field.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

FIG. 5 illustrates an MR sensor constructed in accordance with the method of FIG. 4, prior to the removal of the mask and deposition of the leads.

FIG. 6 illustrates an MR sensor and the associated magnetization constructed in accordance with the method of FIG. 4, after the deposition of the leads.

BEST MODE FOR CARRYING OUT THE INVENTION

The following description is the best embodiment presently contemplated for carrying out the present invention. This description is made for the purpose of illustrating the general principles of the present invention and is not meant to limit the inventive concepts claimed herein.

Figure 3:
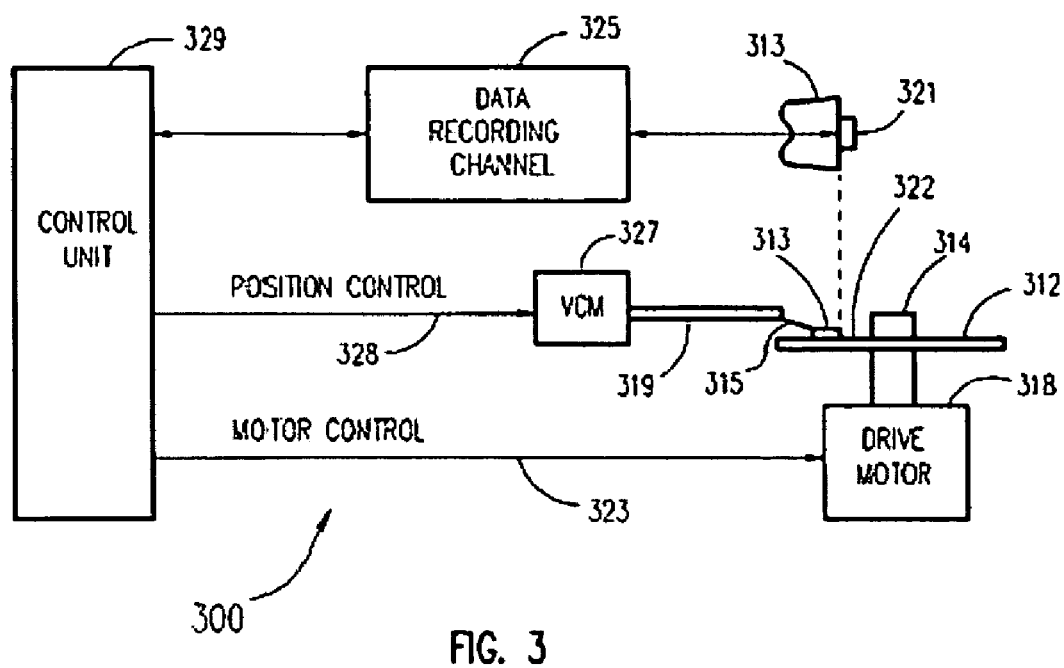
FIG. 3 is a perspective drawing of a magnetic recording disk drive system in accordance with one embodiment of the present invention.

Referring now to FIG. 3, there is shown a disk drive 300 embodying the present invention. As shown in FIG. 3, at least one rotatable magnetic disk 312 is supported on a spindle 314 and rotated by a disk drive motor 318. The magnetic recording media on each disk is in the form of an annular pattern of concentric data tracks (not shown) on disk 312.

At least one slider 313 is positioned on the disk 312, each slider 313 supporting one or more magnetic read/write heads 321. More information regarding such heads 321 will be set forth hereinafter during reference to FIG. 4. As the disks rotate, slider 313 is moved radially in and out over disk surface 322 so that heads 321 may access different portions of the disk where desired data are recorded. Each slider 313 is attached to an actuator arm 319 by way of a suspension 315.

The suspension 315 provides a slight spring force which biases slider 313 against the disk surface 322. Each actuator arm 319 is attached to an actuator 327. The actuator 327 as shown in FIG. 3 may be a voice coil motor (VCM). The VCM comprises a coil movable within a fixed magnetic field, the direction and speed of the coil movements being controlled by the motor current signals supplied by controller 329.

During operation of the disk storage system, the rotation of disk 312 generates an air bearing between slider 313 and disk surface 322 which exerts an upward force or lift on the slider. The air bearing thus counter-balances the slight spring force of suspension 315 and supports slider 313 off and slightly above the disk surface by a small, substantially constant spacing during normal operation.

The various components of the disk storage system are controlled in operation by control signals generated by control unit 329, such as access control signals and internal clock signals. Typically, control unit 329 comprises logic control circuits, storage and a microprocessor.

The control unit 329 generates control signals to control various system operations such as drive motor control signals on line 323 and head position and seek control signals on line 328. The control signals on line 328 provide the desired current profiles to optimally move and position slider 313 to the desired data track on disk 312. Read and write signals are communicated to and from read/write heads 321 by way of recording channel 325.

The above description of a magnetic disk storage system, and the accompanying illustration of FIG. 3 are for representation purposes only. It should be apparent that disk storage systems may contain a large number of disks and actuators, and each actuator may support a number of sliders.

Figure 4:
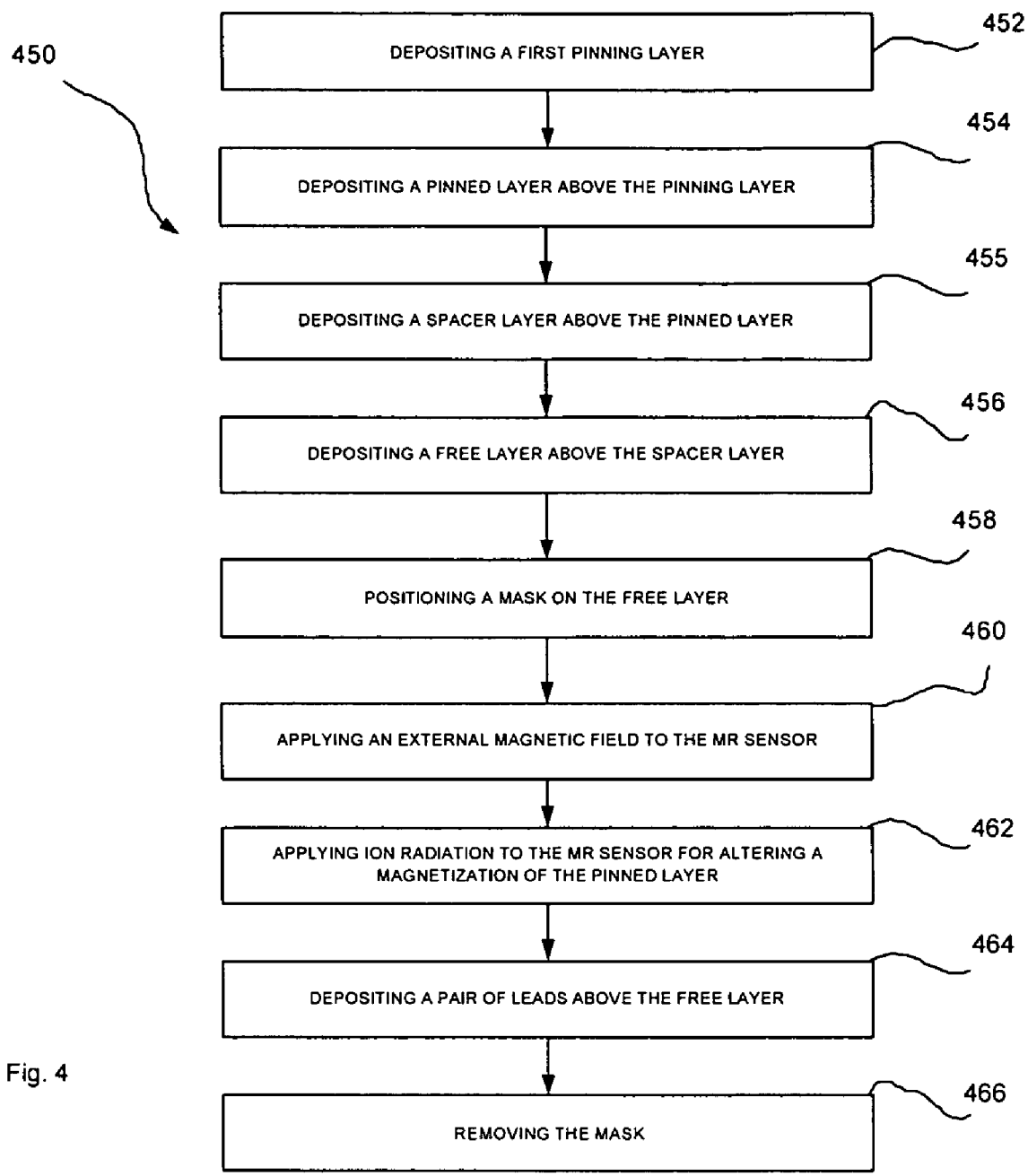
FIG. 4 illustrates a method for manufacturing a magneto-resistive (MR) sensor, in accordance with one embodiment.

FIG. 4 illustrates a method 450 for manufacturing a magneto-resistive (MR) sensor, in accordance with one embodiment. In one embodiment, the MR sensor manufactured in accordance with the current method 450 may be utilized in the context of the disk storage system of FIG. 3. Of course, the present MR sensor may be used in any desired context.

As shown, a pinning layer formed of an antiferromagnetic (AFM) material is deposited in operation 452. Thereafter, a pinned layer formed of ferromagnetic material is deposited above the pinning layer. Note operation 454. An electrically-conducting spacer layer is then deposited on the pinned layer, as indicated in operation 455. A free layer also formed of ferromagnetic material is then deposited above the spacer layer in operation 456.

Further, the materials of the pinning layer, pinned layer, free layer, and spacer layer may be any well known material capable of affording a pinned layer with a magnetization that is pinned by exchange coupling with the pinning layer, and a free layer with a magnetization that is not fixed and free to rotate in response to a field from a recorded magnetic medium.

Next, a mask is then positioned on the free layer in operation 458. Such mask is oriented in a central region of the free layer for allowing the subsequent deposition of leads. An external magnetic field is then applied to the MR sensor in operation 460 and ion radiation is applied to the MR sensor in operation 462 for altering a magnetization of the pinned layer for reasons that will soon become apparent.

In particular, the mask is adapted for protecting a central portion of the pinned layer from the ion radiation. In other words, the mask ensures that only first end portions of the pinned layer are subjected to the ion radiation. This results in first end portions of the pinned layer disposed below the leads having a first pinned layer magnetization parallel with a free layer magnetization, and a second central portion of the pinned layer having a second pinned layer magnetization perpendicular with the free layer magnetization in the absence of an external field. More information regarding the manner in which such first pinned layer magnetization of the end portions of the pinned layer varies as a function of the amount of ion radiation and external magnetic field will be set forth during reference to FIG. 5A.

Thereafter, in operation 464, a pair of leads is deposited above the free layer, and the mask is removed in operation 466. It should be noted that the remaining process of forming the MR sensor and associated head may be carried out in any desired manner that is well known to those of ordinary skill in the art.

FIG. 5 illustrates an MR sensor 500 constructed in accordance with the method 450 of FIG. 4, prior to the removal of the mask and deposition of the leads. Included is a pinned layer 502 and a free layer 504 both disposed above a pinning layer 506. Further, a mask 507 may be positioned on the free layer 504 in preparation for the deposition of the leads.

Figure 1:
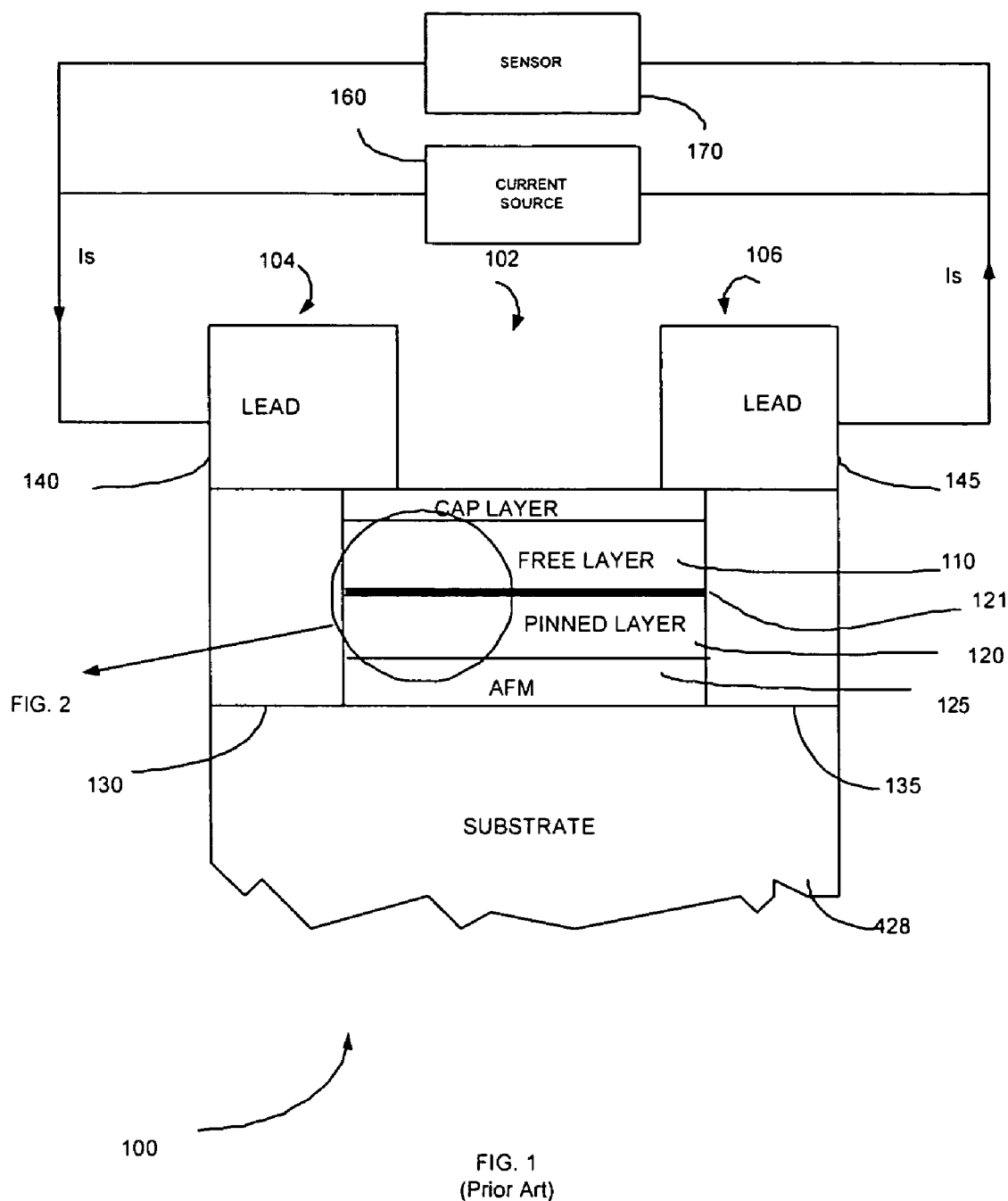
FIG. 1 shows a typical sensor (not drawn to scale) comprising end regions separated by a central region.
Figure 2:
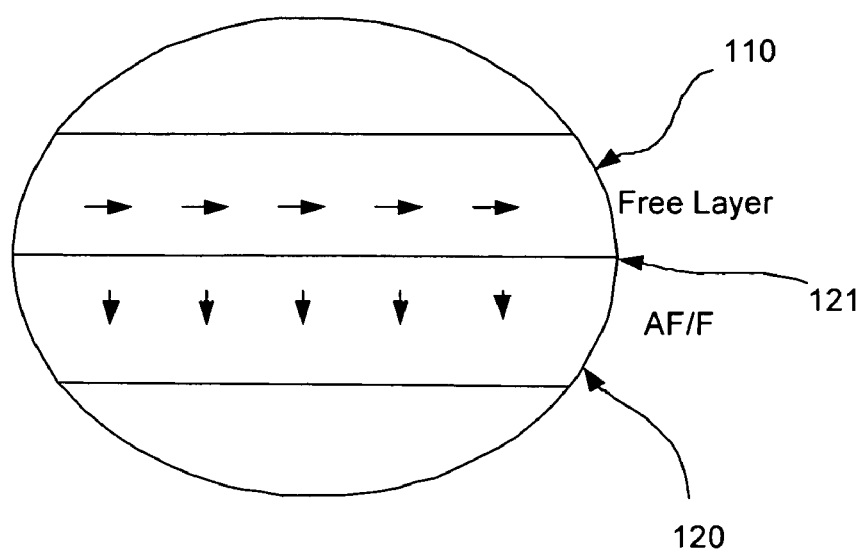
FIG. 2 illustrates the manner in which the magnetizations of the free layer and the pinned layer of the sensor of FIG. 1 are perpendicular, in accordance with the prior art.

It should be noted that the substrate, spacer layer, and various other well know components of the MR sensor 500 may be included at this point, but are not shown for clarity purposes. Note FIG. 1 for more detail regarding such components. As shown, an external magnetic field 508 is applied to the MR sensor 500 simultaneous with ion radiation 510.

Figure 5A:
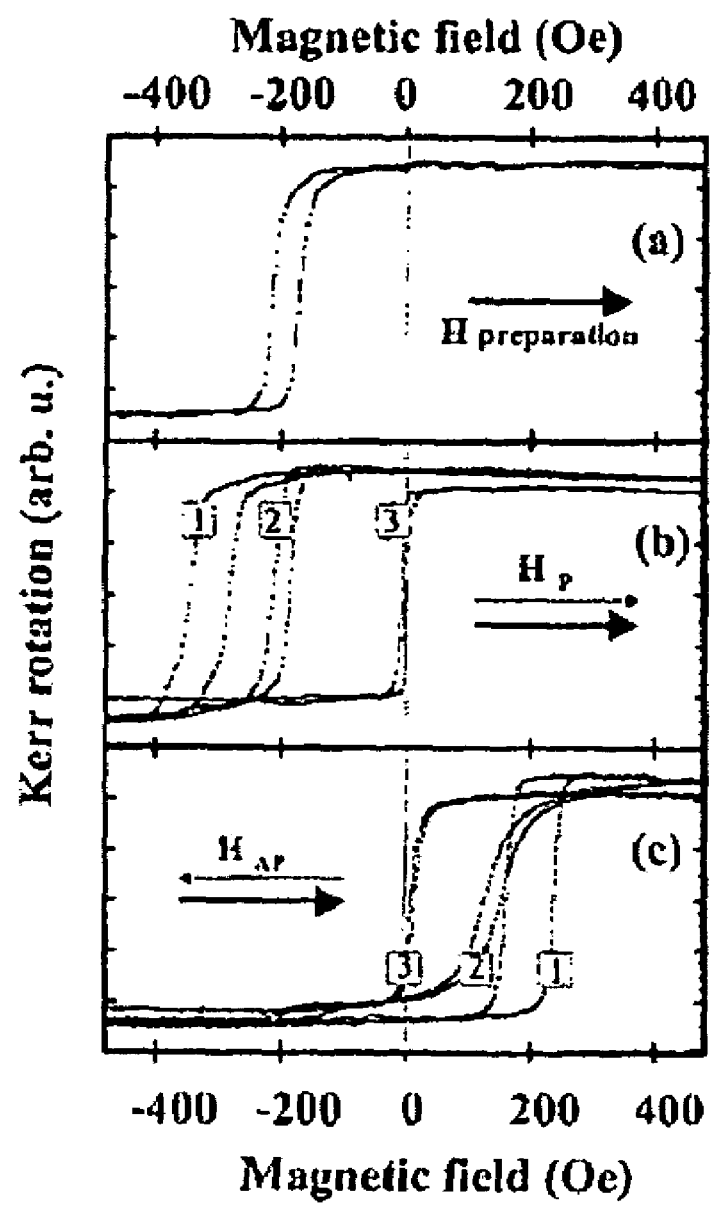
FIG. 5A illustrates the effects of various exemplary combinations of external magnetic fields and ion radiation during the method of FIG. 4.

FIG. 5A illustrates the effects of various exemplary combinations of external magnetic fields 508 and ion radiation 510. In part (a) of FIG. 5A, the hysteresis curve for a FeNi/FeMn exchange bias sample measured at room temperature prior to He Irradiation is shown. Hysteresis curves after irradiation in an external field parallel $H_p$ and antiparallel $H_{ap}$ to the preparation field direction $H_{prep}$ are shown in part (b) and (c) of FIG. 5A, respectively. The different numbers correspond to different ion doses, indicated as follows: part (b) ($H_p$ geometry) 1: $0.25-10^{15}$ ions/cm$^2$, 2: $1.32-10^{15}$ ions/cm$^2$, 3: $9.5-10^{15}$ ions/cm$^2$, part (c) ($H_{ap}$ geometry) 1: $0.25-10^{15}$ ions/cm$^2$, 2: $0.9-10^{15}$ ions/cm$^2$, 3: $9.5-10^{15}$ ions/cm$^2$.

It should be noted that such values may vary per the desires of the user. Further, the external magnetic field 508 and ion radiation 510 may be both applied at a predetermined temperature.

FIG. 6 illustrates an MR sensor 500 and the associated magnetization constructed in accordance with the method 450 of FIG. 4, after the deposition of the leads 601. As shown in FIG. 6, this results in first portions 600 of the pinned layer 502 disposed below the leads 601 having a first pinned layer magnetization 602 parallel with a free layer magnetization 604, and a second portion 606 of the pinned layer 502 having a second pinned layer magnetization 608 perpendicular with the free layer magnetization 604 in the absence of an external field.

In use, the photoresist mask 507 of the MR sensor 500 is adapted for protecting the second portion 606 of the pinned layer 502 from the ion radiation 510. In other words, the photoresist mask 507 of the MR sensor 500 ensures that only the first portions 600 of the pinned layer 502 are subjected to the ion radiation 510.

By this design, the first pinned layer magnetization reduces side-reading effects, and further stabilizes the MR sensor 500.

Figure 7:
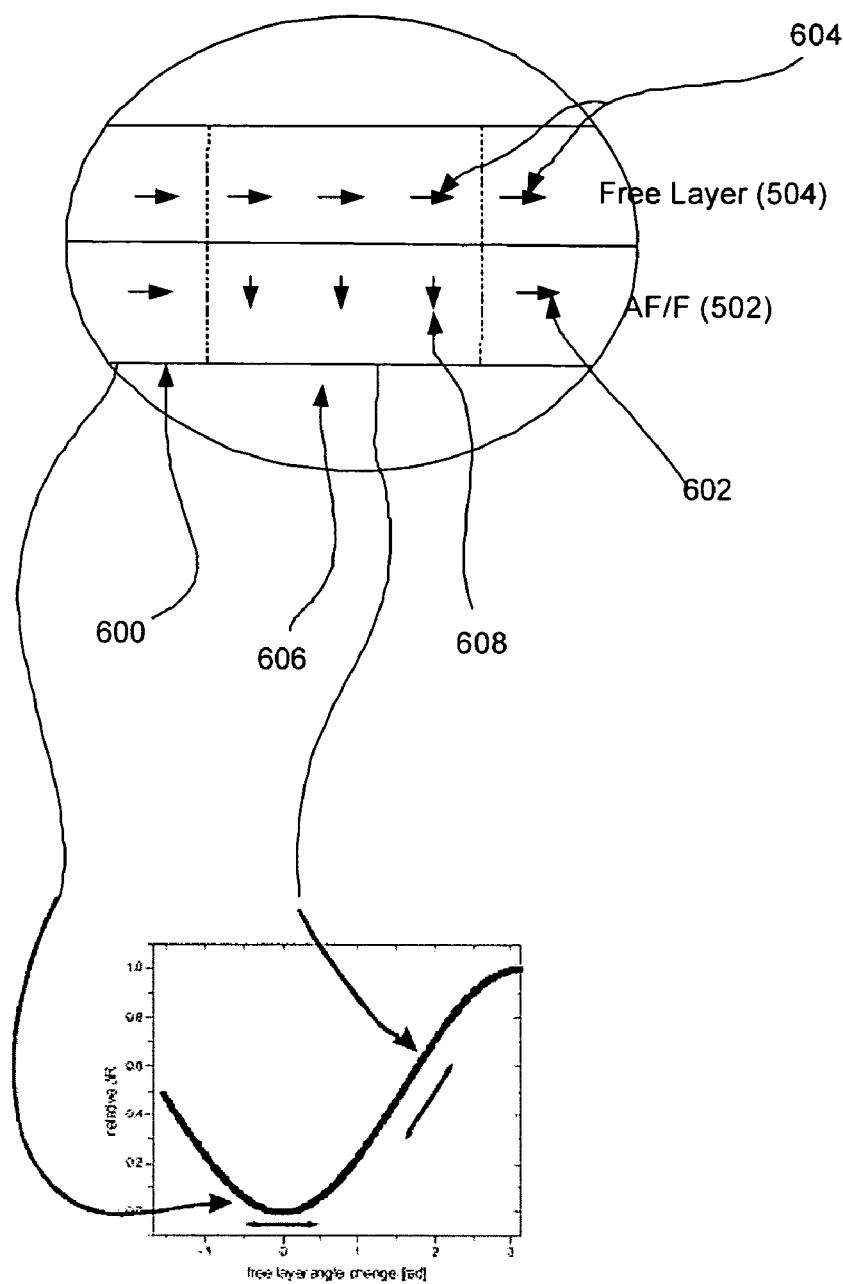
FIG. 7 illustrates the manner in which the side-reading effects are reduced by the foregoing design.

FIG. 7 illustrates the manner in which the side-reading effects are reduced by the foregoing design. As shown, the first portions 600 of the of the pinned layer 502 exhibit a subtle change in resistance in response to the changing magnetization of the free layer 504 during the course of use, as opposed to the sharp change in resistance in response to the changing magnetization of the free layer 504 at the second portion 606 of the pinned layer 502, as a result of the magnetization thereof. See the slopes of the respective portions shown in FIG. 7.

Figure 8:
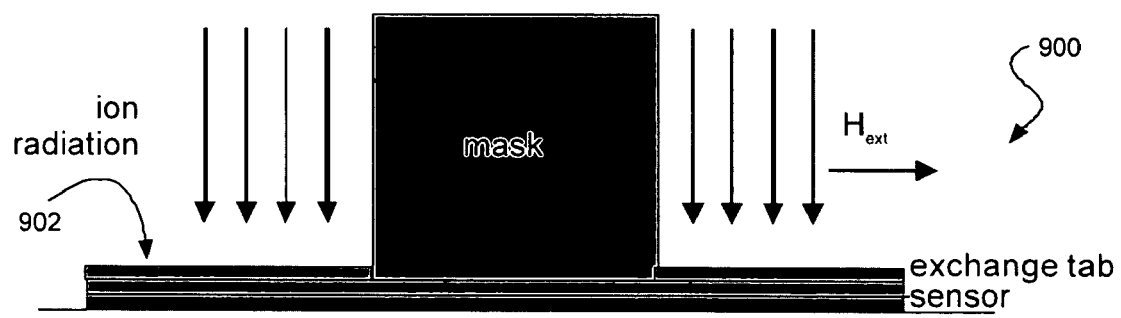
FIGS. 8 and 9 illustrate an "exchange tab-type" MR sensor, in accordance with another embodiment of the present invention.
Figure 9:

FIGS. 8 and 9 illustrate an "exchange tab-type" MR sensor 900, in accordance with another embodiment of the present invention. As shown, a second pinned layer 902 is positioned over the free layer after the masking operation and prior to the deposition of the leads. In such embodiment, the ion radiation and external magnetic field are applied after the masking operation for modifying the magnetization of both the first and second pinned layers.

In particular, the entire second pinned layer and first portions of the first pinned layer exposed by the mask have a first pinned layer magnetization parallel with a free layer magnetization associated with the free layer. Further, a second portion of the first pinned layer masked by the masking operation has a second pinned layer magnetization perpendicular with the free layer magnetization in the absence of an external field.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A process for fabricating a magneto-resistive (MR) sensor, comprising:
   depositing a pinning layer;
   depositing a pinned layer above the pinning layer;
   depositing a free layer above the pinned layer;
   processing the MR sensor such that first portions of the pinned layer have a first pinned layer magnetization parallel with a free layer magnetization, and a second portion of the pinned layer has a second pinned layer magnetization perpendicular with the free layer magnetization in the absence of an external field; and depositing a pair of leads above the free layer, wherein the processing includes applying ion radiation.

2. The process as recited in claim 1, wherein a spacer layer is dispose between the free layer arid the pinned layer.

3. The process as recited in claim 1, wherein the processing includes applying an external magnetic field during the ion radiation.

4. The process as recited in claim 1, wherein die processing includes applying a predetermined temperature during the ion radiation.

5. The process as recited in claim 1, wherein the processing includes masking the flee layer with photoresist for protecting the second portion of the pinned layer from the ion radiation.

6. The process as recited in claim 1, wherein the first pinned layer magnetization reduces side-reading effects.

7. The process as recited in claim 1, wherein die first pinned layer magnetization stabilizes the MR head.

8. A process for fabricating a magneto-resistive (MR) sensor, comprising:

depositing a pinning layer;

depositing a pinned layer above the pinning layer;

depositing a free layer above the pinned layer with a spacer layer therebetween;

positioning a mask on the free layer;

applying an external magnetic field to the MR sensor;

applying ion radiation to the MR sensor for altering a magnetization of the pinned layer;

depositing a pair of leads above the free layer; and removing the mask.

* * * * *

UNITED STATES PATENT AND TRADEMARK OFFICE
CERTIFICATE OF CORRECTION

PATENT NO.         : 7,140,093 B2                                          Page 1 of 1
APPLICATION NO. : 10/934713
DATED              : November 28, 2006
INVENTOR(S)        : McCord It is certified that error appears in the above-identified patent and that said Letters Patent is hereby corrected as shown below:

In the claims:
col. 7, line 6 change "dispose" to --disposed--;
col. 7, line 6 change "arid" to --and--;
col. 7, line 10 change "die" to --the--;
col. 7, line 14 change "flee" to --free--;
col. 8, line 1 change "die" to --the--.

Signed and Sealed this

Third Day of April, 2007

JON W. DUDAS
*Director of the United States Patent and Trademark Office*